US012426217B2

(12) United States Patent
Sugahara et al.

(10) Patent No.: US 12,426,217 B2
(45) Date of Patent: Sep. 23, 2025

(54) ELECTRONIC CONTROL DEVICE

(71) Applicant: Hitachi Astemo, Ltd., Hitachinaka (JP)

(72) Inventors: Ryujo Sugahara, Hitachinaka (JP); Eiji Ichikawa, Hitachinaka (JP); Hideyuki Sakamoto, Hitachinaka (JP); Daisuke Tanaka, Hitachinaka (JP); Hidetatsu Yamamoto, Hitachinaka (JP); Michihito Watarai, Hitachinaka (JP); Minami Teranishi, Tokyo (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 179 days.

(21) Appl. No.: 18/009,911

(22) PCT Filed: May 20, 2021

(86) PCT No.: PCT/JP2021/019180
§ 371 (c)(1),
(2) Date: Dec. 12, 2022

(87) PCT Pub. No.: WO2022/004183
PCT Pub. Date: Jan. 6, 2022

(65) Prior Publication Data
US 2023/0232589 A1    Jul. 20, 2023

(30) Foreign Application Priority Data
Jul. 1, 2020  (JP) ................. 2020-113710

(51) Int. Cl.
*H05K 7/20*    (2006.01)

(52) U.S. Cl.
CPC ..... *H05K 7/20854* (2013.01); *H05K 7/20154* (2013.01); *H05K 7/20409* (2013.01)

(58) Field of Classification Search
CPC .......... H05K 7/20409; H05K 7/20854; H05K 1/144; H05K 1/0203; H05K 1/0204; H05K 1/181; H05K 7/20154; H05K 7/20445; H05K 2201/042; H05K 5/0026; H05K 7/20436; H05K 2201/048; H05K 5/0021; H05K 7/20145; G06F 1/20; H01L 23/36; H01L 23/467; B60R 16/0239
USPC ....................................... 361/697
See application file for complete search history.

(56) References Cited

U.S. PATENT DOCUMENTS

| | | | | |
|---|---|---|---|---|
| 6,560,115 B1* | 5/2003 | Wakabayashi | ....... | H05K 5/0065 361/728 |
| 10,582,644 B1* | 3/2020 | Hur | ...................... | H05K 1/0203 |
| 2002/0172008 A1* | 11/2002 | Michael | ................ | H01L 23/467 361/720 |

(Continued)

FOREIGN PATENT DOCUMENTS

| | | |
|---|---|---|
| JP | S51-6461 U | 1/1976 |
| JP | S63-140697 U | 9/1988 |

(Continued)

*Primary Examiner* — Mandeep S Buttar
(74) *Attorney, Agent, or Firm* — Volpe Koenig

(57) ABSTRACT

An electronic control device includes a housing including a first region in which heat dissipation fins are formed on one side and an electronic component generating the largest amount of heat is in thermal contact with the other side, and a second region in which an electronic component is in thermal contact with the one side and the other side.

16 Claims, 6 Drawing Sheets

(56) References Cited

U.S. PATENT DOCUMENTS

| | | | |
|---|---|---|---|
| 2016/0120019 A1* | 4/2016 | Shedd | F25B 41/40 |
| | | | 361/679.47 |
| 2020/0045823 A1* | 2/2020 | Tomar | H05K 1/162 |
| 2021/0251102 A1* | 8/2021 | Lu | H05K 7/2039 |
| 2023/0051651 A1* | 2/2023 | Von Reitzenstein | ......... |
| | | | H05K 5/0065 |
| 2023/0292470 A1* | 9/2023 | Ueno | H05K 7/20127 |
| 2023/0413486 A1* | 12/2023 | Reinhold | H05K 7/20854 |
| 2024/0196569 A1* | 6/2024 | Yarragunta | G06F 1/20 |

FOREIGN PATENT DOCUMENTS

| | | |
|---|---|---|
| JP | 2005-093969 A | 4/2005 |
| JP | 2011-198985 A | 10/2011 |
| JP | 2012-175032 A | 9/2012 |
| JP | 2012-199354 A | 10/2012 |
| JP | 2013-207161 A | 10/2013 |
| JP | 2014-146702 A | 8/2014 |

\* cited by examiner

ELECTRONIC CONTROL DEVICE

TECHNICAL FIELD

The present invention relates to an electronic control device.

BACKGROUND ART

In recent years, an electronic control device used in an automobile has an internal printed circuit board on which a semiconductor device or the like is mounted. In an electronic control unit (ECU) for autonomous driving, it is necessary to communicate and process a large amount of data at high speed as the autonomous driving LEVEL increases. The ECU performs arithmetic processing on image data and signal data obtained by a camera, a radar, or the like, and transmits a signal to another ECU that controls power steering, a brake, or the like. In this case, circuit specifications such as an information transmission amount or System on Chip (SoC) function requirements vary depending on a type or a functional difference of an automobile, and thus the circuit board tends to be enlarged.

Therefore, in order to suppress an increase in size of a circuit board while meeting various requirements, a technique of connecting a plurality of boards by a connector called a Board to Board (BtoB) connector has been adopted in various fields. As an example of such a technique, for example, there is a technique described in PTL 1.

CITATION LIST

Patent Literature

PTL 1: JP 2012-175032 A

SUMMARY OF INVENTION

Technical Problem

Meanwhile, an in-vehicle space in which an ECU for autonomous driving for a vehicle is disposed is limited. For this reason, an electronic control device used in an automobile is required to achieve both miniaturization of the housing and improvement of heat dissipation. In the technique described in PTL 1, an electronic control device is configured by stacking a plurality of substrates. Therefore, the dimension in the height direction of the electronic control device increases. In addition, since the amount of heat generated by the SoC increases depending on the processing amount of the SoC, natural air cooling is not sufficient, and it is necessary to arrange a fan. In the technique described in PTL 1, there is still room for further study on optimization of the structure when the fan is disposed.

An object of the present invention is to provide an electronic control device capable of achieving both miniaturization and improvement of heat dissipation.

Solution to Problem

In order to solve the above problem, for example, a configuration described in the claims is adopted.

The present application includes a plurality of means for solving the above-described problems, and one of them is an electronic control device including a housing including a first region in which heat dissipation fins are formed on one side and an electronic component generating the largest amount of heat is in thermal contact with the other side, and a second region in which an electronic component is in thermal contact with the one side and the other side.

Advantageous Effects of Invention

According to the present invention, it is possible to achieve both miniaturization of the electronic control device and improvement of heat dissipation.

Problems, configurations, and effects other than those described above will be clarified by the following description of embodiments.

DESCRIPTION OF EMBODIMENTS

Figure 1:
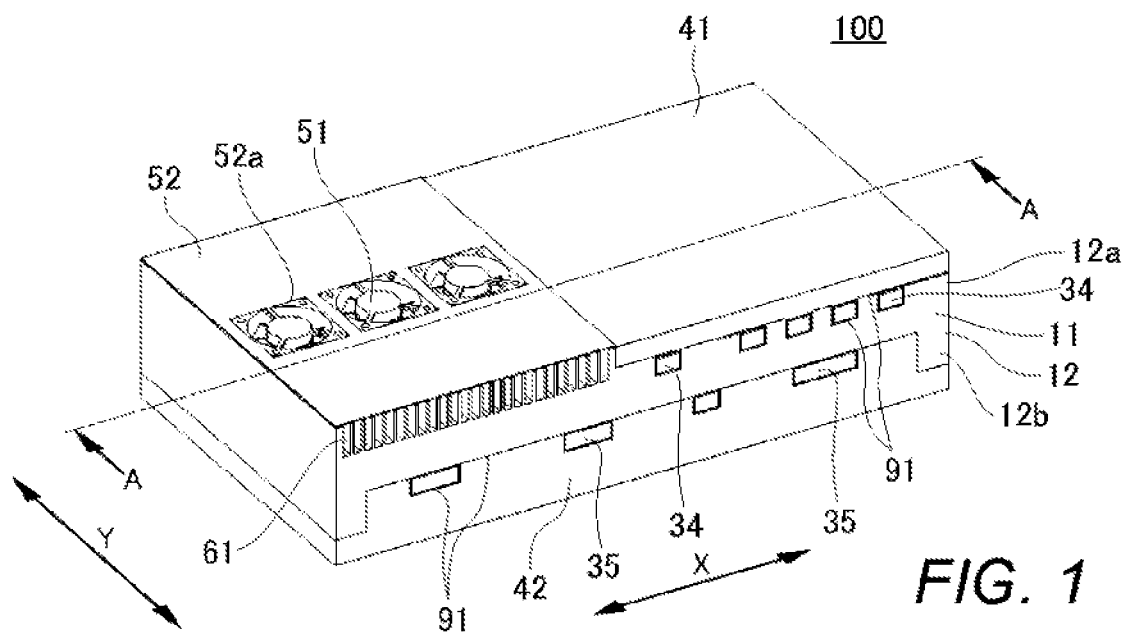
FIG. 1 is a perspective view schematically illustrating an external appearance of an electronic control device according to a first embodiment.

Hereinafter, embodiments of the present invention will be described in detail with reference to the drawings. In the present specification and the drawings, elements having substantially the same function or configuration are denoted by the same reference numerals, and the redundant descriptions will be omitted.

First Embodiment

FIG. 1 is a perspective view schematically illustrating an external appearance of an electronic control device according to a first embodiment. Further, FIG. 2 is an exploded perspective view of the electronic control device according to the first embodiment as viewed from above, and FIG. 3 is an exploded perspective view of the electronic control device according to the first embodiment as viewed from below.

Figure 2:
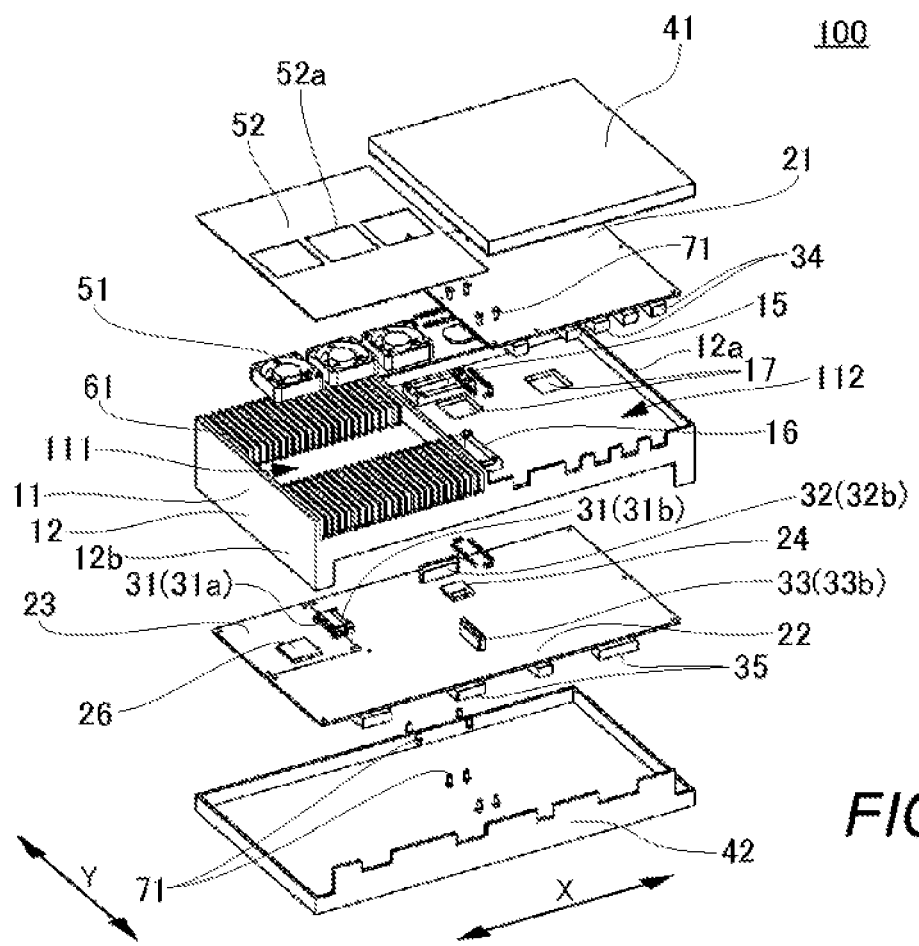
FIG. 2 is an exploded perspective view of the electronic control device according to the first embodiment as viewed from above.
Figure 3:
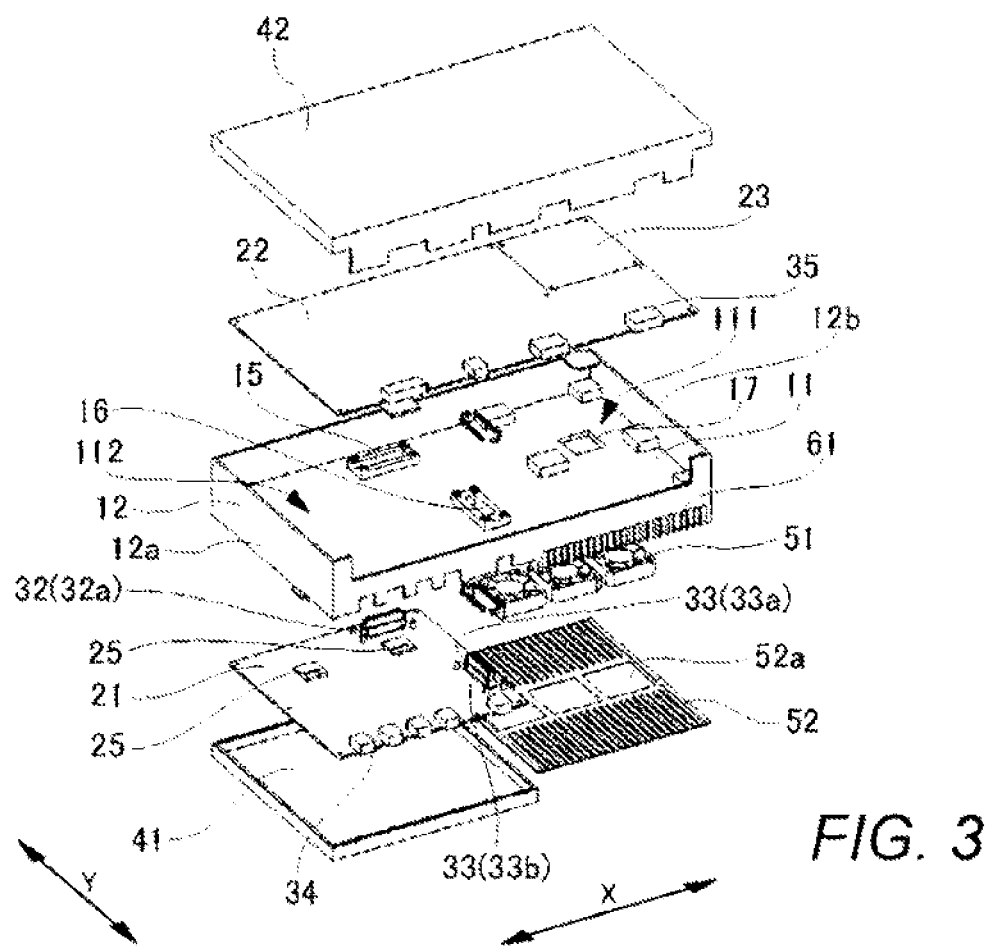
FIG. 3 is an exploded perspective view of the electronic control device according to the first embodiment as viewed from below.

As illustrated in FIGS. 1 to 3, an electronic control device 100 is an electronic control unit (ECU) used in an automobile, for example. The electronic control device 100 includes a housing 11, a first substrate 21, a second substrate 22, a third substrate 23, a first cover 41, a second cover 42, and a fan cover 52. Each of the first substrate 21, the second substrate 22, and the third substrate 23 is a circuit board (printed board) having a wiring pattern. The second substrate 22 corresponds to a motherboard, and each of the first substrate 21 and the third substrate 23 corresponds to a daughter board. As described above, by dividing the first substrate 21, the second substrate 22, and the third substrate 23 as independent circuit boards, it is possible to flexibly change any one or two substrates and cope with depending on the type or functional difference of the automobile. Although FIGS. 1 and 2 illustrate an example in which the second substrate 22 and the third substrate 23 are divided, the present invention is not limited thereto, and for example, the second substrate 22 and the third substrate 23 may be configured by one substrate, or the number of divisions of the substrates may be increased to three or more.

Furthermore, in the present embodiment, the side on which the first cover 41 is disposed as viewed from the housing 11 is described as the upper side, and the side on which the second cover 42 is disposed is described as the lower side. However, the up-down direction (vertical direction) and the left-right direction (horizontal direction) may change depending on the direction of the electronic control device 100 when the electronic control device 100 is mounted on a vehicle.

Housing 11

The housing 11 is made of, for example, a metal material such as aluminum or an aluminum alloy. Therefore, the housing 11 has conductivity and thermal conductivity. The housing 11 has a first region 111 and a second region 112. In the present embodiment, as an example, the first region 111 and the second region 112 are divided in the longitudinal direction X of the housing 11. That is, in the present embodiment, the first region 111 and the second region 112 are separated from each other by the substantially central portion in the longitudinal direction X of the housing 11 as a boundary. However, the boundary separating the first region 111 and the second region 112 can be arbitrarily set in the housing 11. The housing 11 may have a predetermined region in addition to the first region 111 and the second region 112.

Heat dissipation fins 61 are formed in the first region 111 of the housing 11. The heat dissipation fins 61 are plate-shaped fins formed on an upper surface side (one side) of the first region 111. Preferably, the heat dissipation fin 61 is formed integrally with the housing 11. A peripheral wall 12 is formed on the outer peripheral portion of the housing 11. The peripheral wall 12 includes a first peripheral wall 12a formed on the upper surface side of the housing 11 and a second peripheral wall 12b formed on the lower surface side of the housing 11. The first peripheral wall 12a protrudes upward from the upper surface of the housing 11, and the second peripheral wall 12b protrudes downward from the lower surface of the housing 11.

Two holes 15 and 16 are formed in the housing 11. Each of the holes 15 and 16 is a hole through which BtoB connectors 32 and 33 are inserted in order to electrically connect the first substrate 21 and the second substrate 22 by the BtoB connectors 32 and 33, which will be described later. That is, each of the holes 15 and 16 is a hole for connecting connectors. Each of the holes 15 and 16 is formed so as to penetrate the housing 11 in the thickness direction (up-down direction). Each of the holes 15 and 16 is formed in a rectangular shape in plan view. At least one of the holes 15 and 16 is formed such that the longitudinal direction of the hole is substantially parallel to the X direction which is the arrangement direction of the first region 111 and the second region 112. In the present embodiment, as an example, the longitudinal direction of the hole 15 is substantially parallel to the arrangement direction of the first region 111 and the second region 112.

First Substrate 21

Figure 4:
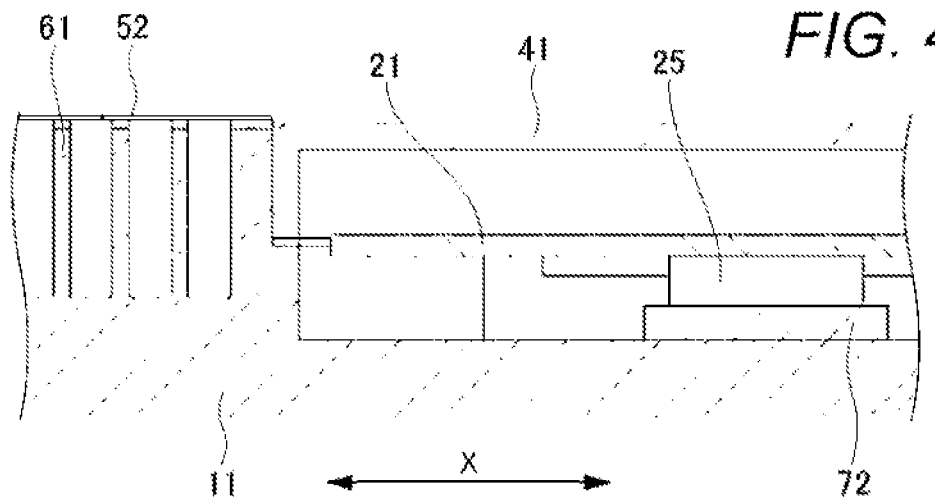
FIG. 4 is a partial cross-sectional view of the electronic control device according to the first embodiment.

The first substrate 21 is a board fixedly mounted on the upper surface side of the housing 11. The first substrate 21 is disposed at a position adjacent to the heat dissipation fins 61 in the first region 111 of the housing 11. As illustrated in FIG. 3, two electronic components 25 are mounted on a lower surface of the first substrate 21 by a ball grid array (BGA). "Mounted by BGA" means "surface-mounted using solder balls". The electronic component 25 is an electronic component that generates a smaller (fewer) amount of heat than an electronic component 26 described later. The electronic component 25 is, for example, an image processing system on chip (SoC). As illustrated in FIG. 4, the electronic component 25 is disposed so as to be in contact with the upper surface of the housing 11 via a heat dissipation material 72. As a result, the electronic component 25 is in thermal contact with the housing 11 on the upper surface side of the second region 112. Therefore, heat generated by the electronic component 25 during high-speed communication is transmitted to the housing 11 via the heat dissipation material 72. The heat dissipation material 72 is made of, for example, heat dissipation grease. The thermal contact means a contact state in which heat can smoothly move between two objects or two target portions.

In addition to the electronic components 25 described above, a connector half body 32a of the BtoB connector 32 and a connector half body 33a of the BtoB connector 33 are mounted on the lower surface of the first substrate 21 by BGA. That is, the electronic components 25, the connector half body 32a of the BtoB connector 32, and the connector half body 33a of the BtoB connector 33 are mounted on the same surface of the first substrate 21 by BGA. The connector half body 32a is a connector having a male/female relationship with a connector half body 32b of the BtoB connector 32 mounted on the second substrate 22, and is configured to be fittable with the connector half body 32b. That is, the BtoB connector 32 is configured by the connector half body 32a and the connector half body 32b. The connector half body 33a is a connector having a male/female relationship with a connector half body 33b of the BtoB connector 33 mounted on the second substrate 22, and is configured to be fittable with the connector half body 33b. That is, the BtoB connector 33 is configured by the connector half body 33a and the connector half body 33b. Each of the BtoB connector 32 and the BtoB connector 33 corresponds to a first BtoB connector that electrically connects the first substrate 21 and the second substrate 22. Further, a plurality of connectors 34 are mounted on the lower surface of the first substrate 21. Each connector 34 is a connector for communicating with the outside and corresponds to a first connector.

Second Substrate 22

The second substrate 22 is a board fixedly mounted on a lower surface side (the other side) of the housing 11. The first substrate 21 and the second substrate 22 are disposed so as to be stacked in the up-down direction that is a direction perpendicular to each substrate surface. Then, the second region 112 of the housing 11 is interposed between the first substrate 21 and the second substrate 22. An electronic component 24 is mounted on an upper surface of the second substrate 22 by BGA. The electronic component 24 is an electronic component that generates a smaller amount of heat than the electronic component 26, which will be described later. The electronic component 24 is, for example, a PCI Express Switch (PCIeSW). The electronic component 24 is disposed so as to be in contact with the lower surface of the housing 11 via a heat dissipation material (for example, heat dissipation grease) not illustrated. As a result, the electronic component 24 is in thermal contact with the housing 11 on the lower surface side (the other side) of the second region 112. Therefore, heat generated by the electronic component 24 during high-speed communication is transmitted to the housing 11 via the heat dissipation material. The second substrate 22 is disposed so as to face the first substrate 21 in the up-down direction that is the direction perpendicular to the substrate surface. By arranging the first substrate 21 and the second substrate 22 in this manner, it is possible to suppress the dimension in the left-right direction of the entire electronic control device 100 as compared with the case where these substrates are arranged side by side in the left-right direction.

In addition to the electronic component 24 described above, a connector half body 31*b* of the BtoB connector 31, the connector half body 32*b* of the BtoB connector 32, and the connector half body 33*b* of the BtoB connector 33 are mounted on the upper surface of the second substrate 22 by BGA. That is, the electronic component 24, the connector half body 31*b* of the BtoB connector 31, the connector half body 32*b* of the BtoB connector 32, and the connector half body 33*b* of the BtoB connector 33 are mounted on the same surface of the second substrate 22 by BGA. The connector half body 31*b* is a connector having a male/female relationship with a connector half body 31*a* of the BtoB connector 31 mounted on the third substrate 23, and is configured to be fittable to the connector half body 31*a*. That is, the BtoB connector 31 is configured by the connector half body 31*a* and the connector half body 31*b*. The BtoB connector 31 corresponds to a second BtoB connector that electrically connects the second substrate 22 and the third substrate 23. Among the connector half body 31*a* and the connector half body 31*b* constituting the BtoB connector 31, the connector half body 31*a* is provided on the surface of the third substrate 23 on which the electronic component 26 is mounted, that is, the upper surface of the third substrate 23, and the connector half body 31*b* is provided on the surface of the second substrate 22 on which the electronic component 24 is mounted, that is, the upper surface of the second substrate 22. As a result, the second substrate 22 and the third substrate 23 can be connected by the BtoB connector 31 in a state where the mounting surface of the electronic component 24 on the second substrate 22 and the mounting surface of the electronic component 26 on the third substrate 23 are aligned in the same direction. Meanwhile, the connector half body 32*b* is fitted to the connector half body 32*a* when the electronic control device 100 is assembled. The connector half body 33*b* is fitted to the connector half body 33*a* when the electronic control device 100 is assembled. Further, a plurality of connectors 35 are mounted on the lower surface of the second substrate 22. Each connector 35 is a connector for communicating with the outside and corresponds to a second connector. Here, the connector 34 provided on the first substrate 21 and the connector 35 provided on the second substrate 22 are disposed on the same side of the side surface of the housing 11 in the lateral direction Y of the housing 11. By arranging the connector 34 and the connector 35 in this manner, the connection directions (fitting directions) of the connectors (not illustrated) having a male/female relationship with the connectors 34 and 35 can be aligned in the same direction.

Third Substrate 23

The third substrate 23 is disposed on the same plane as the second substrate 22. The third substrate 23 is provided on a region where the heat dissipation fins 61 are formed. The third substrate 23 is mounted on the lower surface side of the housing 11 together with the second substrate 22. The electronic component 26 is mounted on an upper surface of the third substrate 23 by BGA. The electronic component 26 is an electronic component that generates the biggest (largest) amount of heat among the electronic components mounted on the first substrate 21, the second substrate 22, and the third substrate 23. The electronic component 26 is, for example, an accelerator (accelerator SoC). The electronic component 26 is configured by a surface mount package (for example, a BGA package). The electronic component 26 is disposed so as to be in contact with the lower surface of the housing 11 via a heat dissipation material (for example, heat dissipation grease) not illustrated. As a result, the electronic component 26 is in thermal contact with the housing 11 on the lower surface side (the other side) of the first region 111. Therefore, heat generated by the electronic component 26 during high-speed communication is transmitted to the housing 11 via the heat dissipation material.

On the upper surface of the third substrate 23, the connector half body 31*a* of the BtoB connecter 31 is mounted by BGA in addition to the electronic component 26 described above. That is, the electronic component 26 and the connector half body 31*a* of the BtoB connector 31 are mounted on the same surface of the third substrate 23 by BGA. The connector half body 31*a* is fitted to the connector half body 31*b* described above from the horizontal direction. As a result, the second substrate 22 and the third substrate 23 are horizontally connected by the BtoB connector 31.

First Cover 11

The first cover 41 is a cover provided so as to cover an opening on the upper surface side (one side) of the housing 11 in the up-down direction. The first cover 41 is attached so as to cover the first substrate 21 from the outside. The lower surface of the first cover 41 is disposed to face the upper surface of the first substrate 21, and the upper surface of the housing 11 is disposed to face the lower surface of the first substrate 21. Therefore, the first substrate 21 is disposed in the space formed by the housing 11 and the first cover 41 in the up-down direction. The first cover 41 is formed in a quadrangular shape in plan view with a dimension larger than the outer dimension of the first substrate 21 so as to shield the entire area of the first substrate 21. The first cover 41 is made of, for example, a metal material such as an iron alloy, more specifically, a plated steel plate or the like. By providing the first cover 41 in the electronic control device 100, it is possible to prevent intrusion of dust or the like from the outside to the inside of the electronic control device 100 by the first cover 41 and to suppress the occurrence of contamination. In addition, by covering the first substrate 21 with the first cover 41, it is possible to prevent the external contact with the first substrate 21 by the first cover 41 and to protect the first substrate 21 from external damage or the like.

Second Cover 42

The second cover 42 is a cover provided so as to cover an opening on the other side (lower surface side) of the housing 11 in the up-down direction. The second cover 42 is attached so as to cover the second substrate 22 and the third substrate 23. The upper surface of the second cover 42 is disposed to face the lower surfaces of the second substrate 22 and the third substrate 23, and the lower surface of the housing 11 is disposed to face the upper surfaces of the second substrate 22 and the third substrate 23. Therefore, the second substrate 22 and the third substrate 23 are disposed in the space formed by the housing 11 and the second cover 42 in the up-down direction. The second cover 42 is formed in a quadrangular shape in plan view with a dimension larger than the dimension of the outermost peripheral portion of the second substrate 22 and the third substrate 23 so as to shield the entire area of the second substrate 22 and the third substrate 23. The second cover 42 is made of, for example, a metal material such as an iron alloy, more specifically, a plated steel plate or the like. By providing the second cover 42 in the electronic control device 100, it is possible to prevent intrusion of dust or the like from the outside to the inside of the electronic control device 100 by the second cover 42 and to suppress the occurrence of contamination. In addition, by covering the second substrate 22 and the third substrate 23 with the second cover 42, it is possible to prevent external contact with the second substrate 22 and the third substrate 23 by the second cover 42 and to protect the second substrate 22 and the third substrate 23 from external damage or the like.

Fan Cover 52

A fan cover 52 is a cover provided to cover the heat dissipation fins 61. Three openings 52a are formed in the fan cover 52. The three openings 52a are openings for ventilation and are formed corresponding to the three fans 51. The fan 51 is a fan for forced air cooling. The number of fans 51 can be changed as necessary. The fan 51 may be provided as necessary, and the fan cover 52 may also be provided as necessary. The opening 52a serves as an intake port for taking air from the outside of the electronic control device 100 into the fan 51 when the fan 51 is driven. The fan 51 is provided on the fin side (upper surface side) of the first region 111 of the housing 11. Specifically, the intermediate portion on the upper surface side of the first region 111 is formed in a recessed groove having no fin structure, and the three fans 51 are arranged in line in the recessed groove. As a result, the fan 51 is disposed at the center portion of the heat dissipation fin 61. The fan cover 52 is attached to the upper surface side of the housing 11 together with the first cover 41. The fan cover 52 is disposed adjacent to the first cover 41. The fan cover 52 is formed in a quadrangular shape in plan view with a dimension corresponding to the size of the heat dissipation fins 61. The fan cover 52 is made of a metal material.

When the fan cover 52 is attached to the upper surface side of the housing 11 and the three fans 51 are driven, air is sucked into the fan 51 from each opening 52a, and the sucked air flows into the heat dissipation fins 61 by the blowing function of the fan 51. As a result, an air flow is formed along the heat dissipation fins 61. Therefore, the entire heat dissipation fins 61 can be cooled. Heat generated by the electronic component 25 during high-speed communication is conducted to heat dissipation fins 61 of the housing 11. For this reason, the heat generated by the electronic component 25 can be efficiently released to the outside of the housing 11 by air-cooling the heat dissipation fins 61 with the fans 51. In addition, since heat generated by the electronic component 26 during high-speed communication is also conducted to the heat dissipation fins 61 of the housing 11, the heat generated by the electronic component 26 can be efficiently released to the outside of the housing 11 by air-cooling the heat dissipation fins 61 with the fans 51.

The electronic control device 100 having the above configuration is assembled by, for example, the following procedure.

First, the connector half body 31b mounted on the second substrate 22 and the connector half body 31a mounted on the third substrate 23 are fitted to each other. As a result, the second substrate 22 and the third substrate 23 are horizontally connected by the BtoB connector 31. Therefore, a large amount of data can be communicated between the second substrate 22 and the third substrate 23 at high speed through the BtoB connector 31.

Next, the second substrate 22 and the third substrate 23 are attached to the lower surface side of the housing 11. At this time, the connector half bodies 32b and 33b mounted on the second substrate 22 are disposed inside the corresponding holes 15 and 16, respectively. Then, the second substrate 22 and the housing 11 are fastened with a screw 71 (see FIG. 1).

Next, the second cover 42 is attached to the lower surface side of the housing 11 so as to cover the second substrate 22 and the third substrate 23. At this time, a gap between the second cover 42 and the connector 35, and a gap between the second cover 42 and the housing 11 are filled with a waterproof material 91 (see FIG. 1). By providing the waterproof material 91, it is possible to prevent water from entering the electronic control device 100 from the outside to the inside, and to protect the substrates 21 to 23 in the electronic control device 100.

Next, three fans 51 are attached to the upper surface side of the housing 11.

Next, a fan cover 52 is attached to the upper surface side of the housing 11 so as to cover the heat dissipation fins 61.

Next, the first substrate 21 is attached to the upper surface side of the housing 11. At this time, the connector half bodies 32a and 33a mounted on the first substrate 21 are disposed inside the corresponding holes 15 and 36, respectively. Then, the first substrate 21 and the housing 11 are fastened with the screw 71 (see FIG. 1). Further, the connector half body 32a is fitted to the connector half body 32b, and the connector half body 33a is fitted to the connector half body 33b. As a result, the first substrate 21 and the second substrate 22 are vertically connected by the BtoB connector 32 and the BtoB connector 33. Further, the connector half bodies 33a and 33b constituting the BtoB connector 33 are arranged in the space of the hole 16, and the connector half bodies 33a and 33b are connected to each other in this space. Although not illustrated, the connector half bodies 32a and 32b constituting the BtoB connector 32 are arranged in the space of the hole 15, and the connector half bodies 32a and 32b are connected to each other in this space.

As described above, by connecting the first substrate 21 and the second substrate 22 with the BtoB connector 32 and the BtoB connector 33, a large amount of data can be communicated at high speed between the first substrate 21 and the second substrate 22 through the BtoB connector 32 and the BtoB connector 33.

Next, the first cover 41 is attached to the upper surface side of the housing 11 so as to cover the first substrate 21. At this time, a gap between the first cover 41 and the connector 34 and a gap between the first cover 41 and the housing 11 are filled with the waterproof material 91 (see FIG. 1). The reason for providing the waterproof material 91 is as described above.

Thus, the assembly of the electronic control device 100 is completed.

The assembly procedure of the electronic control device 100 is not limited to the above-described procedure and can be changed as appropriate.

Effects of First Embodiment

In the first embodiment described above, included is the housing including the first region 111 in which the heat dissipation fins 61 are formed on the upper surface side that is one side, and the electronic component 26 generating the largest amount of heat is in thermal contact with the lower surface side that is the other side, and the second region 112 in which the electronic components 24 and 25 are in thermal contact with the upper surface side and the lower surface side. As a result, heat generated by the electronic component 26 generating the largest amount of heat can be released preferentially using the heat dissipation fins 61. Further, among the electronic component 24 and the electronic component 25 that do not generate as much heat as the electronic component 26, the electronic component 24 is brought into thermal contact with the lower surface side of the housing 11, and the electronic component 25 is brought into thermal contact with the upper surface side of the housing 11, whereby the heat generated by each of the electronic components 24 and 25 can be released to the housing 11.

Therefore, according to the first embodiment, it is possible to suppress the entire housing 11 from spreading in the lateral direction. Further, in the longitudinal direction, the upper surface side of the first region 111 of the housing 11 is a single-layer region in which the substrates are not stacked and mounted, and the heat dissipation fins 61 are formed on the upper surface side of the first region 111, and the electronic component 26 dissipating a large amount of heat is brought into thermal contact with the lower surface side of the first region 111 on the back aide thereof to dissipate heat of the electronic component 26. The second region 112 of the housing 11 is a stacked region in which the first substrate 21 and the second substrate 22 are stacked and mounted, and the electronic components 24 and 25 are collectively arranged in the second region 112. Therefore, it is possible to efficiently dissipate heat, while miniaturizing the electronic control device 100. As a result, it is possible to achieve both miniaturization of the electronic control device 100 and improvement of heat dissipation.

In the first embodiment, the first substrate 21 is mounted on the upper surface side of the second region 112 of the housing 11, and the second substrate 22 is mounted on the lower surface side of the second region 112 on the opposite side. As a result, when the first substrate 21 and the second substrate 22 are connected by the BtoB connectors 32 and 33, variations in the thickness dimension of each of the substrates 21 and 22 can be absorbed by the connection portions of the BtoB connectors 32 and 33. As a result, the variation in the thickness dimension of each of the substrates 21 and 22 can be removed from the connection tolerance when the first substrate 21 and the second substrate 22 are connected by the BtoB connectors 32 and 33. Therefore, the clearance between the first substrate 21 and the second substrate 22 can be narrowed, and the electronic control device 100 can be miniaturized in the height direction (up-down direction). Further, in the first embodiment, the first substrate 21 is fixed to the upper surface side of the housing 11, and the second substrate 22 is fixed to the lower surface side of the housing 11. As a result, positional displacement of the first substrate 21 with respect to the housing 11 is suppressed, and positional displacement of the second substrate 22 with respect to the housing 11 is suppressed. Therefore, a thermal contact state between the second region 112 and the electronic component 25 and a thermal contact state between the second region 112 and the electronic component 24 can be reliably maintained.

In the first embodiment, the electronic component 26 which is an accelerator and the connector half body 31a of the BtoB connector 31 are mounted on the same surface (upper surface) of the third substrate 23 by BGA. Further, the electronic component 24 which is a PCIeSW, the connector half, body 31b of the BtoB connector 31, the connector half body 32b of the BtoB connector 32, and the connector half body 33b of the BtoB connector 33 are mounted on the same surface (upper surface) of the second substrate 22 by BGA. In addition, the electronic component 25 which is an image processing SoC, the connector half body 32a of the BtoB connector 32, and the connector half body 33a of the BtoB connector 33 are mounted on the same surface (lower surface) of the first substrate 21 by BGA. As described above, by mounting the components (24, 25, 26, 31, 32, and 33) mounted by BGA on the substrate such that all the mounting surfaces of the components are on the housing 11 side, the components mounted by BGA can be concentrated on one surface side in each substrate. Therefore, when each component mounted on the substrate by BGA is bonded to the substrate by the solder reflow method, it is not necessary to invert the substrate. Therefore, it is possible to suppress peeling of the component from the substrate at the time of solder reflow and to improve the yield.

In the first embodiment, the electronic component 26 mounted on the third substrate 23 is an accelerator, the electronic component 25 mounted on the first substrate 21 is an image processing SoC 25, and the electronic component 24 mounted on the second substrate 22 is a PCIeSW. As a result, heat generated by the electronic component 26 as an accelerator can be quickly transferred to the heat dissipation fins 61. In addition, heat generated by the electronic component 25 which is an image processing SoC and the electronic component 24 which is a PCIeSW can be transferred to the heat dissipation fins 61 through the housing 11.

In the first embodiment, the longitudinal direction of the hole 15 for inserting the BtoB connector 32 is substantially parallel to the X direction which is the arrangement direction of the first region 111 and the second region 112. Here, air exists inside the hole 15. The heat transfer coefficient of air is significantly lower than the heat transfer coefficient of the metal material (substantial portion) constituting the housing 11. Therefore, when the longitudinal direction of the hole 15 is perpendicular to the X direction, the actual dimension of the housing 11 that contributes to heat transfer between the first region 111 and the second region 112 is narrowed. On the other hand, when the longitudinal direction of the hole 15 is substantially parallel to the X direction, the actual dimension of the housing 11 that contributes to heat transfer between the first region 111 and the second region 112 can be widely secured. Therefore, when the hole 15 is formed in the housing 11, it is possible to suppress the resistance to heat transfer due to the presence of the hole 15.

Second Embodiment

Next, a second embodiment will be described.

Figure 5:
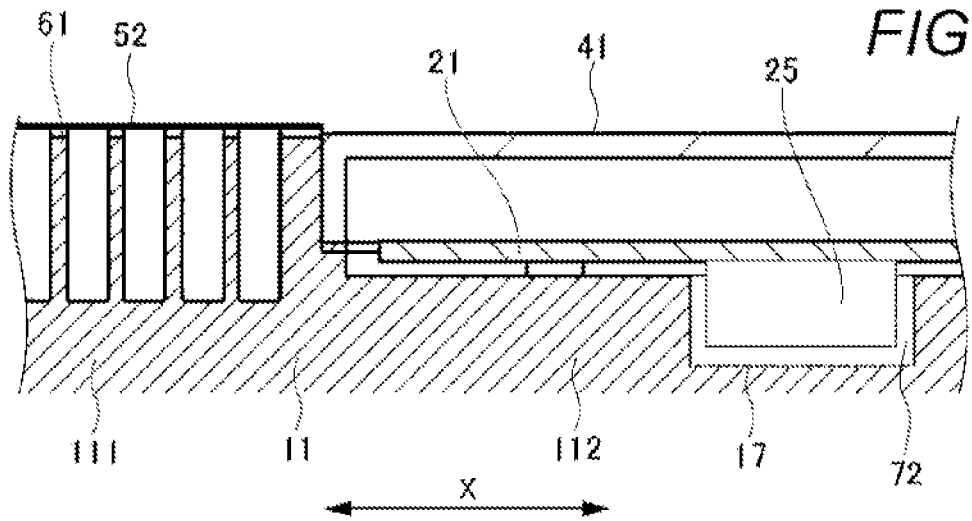
FIG. 5 is a cross-sectional view illustrating a main part of an electronic control device according to a second embodiment.

FIG. 5 is a cross-sectional view illustrating a main part of an electronic control device according to the second embodiment.

As illustrated in FIG. 5, a recess 17 is formed on the upper surface of the second region 112 of the housing 11. The recess 17 is formed at a position where the electronic component 25 is disposed when the first substrate 21 is attached to the housing 11. As shown in FIG. 2, the recess 17 is formed in a rectangular shape so as to follow the outer shape of the electronic component 25. The depth dimension of the recess 17 is set according to the height dimension of the electronic component 25. The electronic component 25 is disposed in the recess 17. Similarly to the relationship between the recess 17 and the electronic component 25 described above, the recess 17 (see FIG. 3) is formed in the lower surface of the first region 111 of the housing 11, and the electronic component 26 is disposed in the recess 17. A recess (not illustrated) is also formed on the lower surface of the second region 112 of the housing 11, and the electronic component 24 is disposed in the recess. As described above, by adopting the configuration in which each of the electronic components 24, 25, and 26 is disposed in the corresponding recess of the housing 11, the thickness dimension of the housing 11 and the height dimension of the electronic control device 100 can be suppressed to be small.

In addition, as illustrated in FIG. 5, by adopting a configuration in which the gap formed between the recess 17 and the electronic component 25 is filled with the heat dissipation material 72, the thermal contact area between the electronic component 25 and the housing 11 becomes larger than that in the configuration illustrated in FIG. 4. Therefore, the heat generated by the electronic component 25 can be transferred to the housing 11 with higher efficiency. Therefore, it is possible to further improve the heat dissipation effect. Such an effect can also be obtained when a gap between a recess (not illustrated) and the electronic component 24 is filled with a heat dissipation material or when a gap between the recess 17 and the electronic component 26 is filled with a heat dissipation material.

Third Embodiment

Next, a third embodiment will be described.

Figure 6:
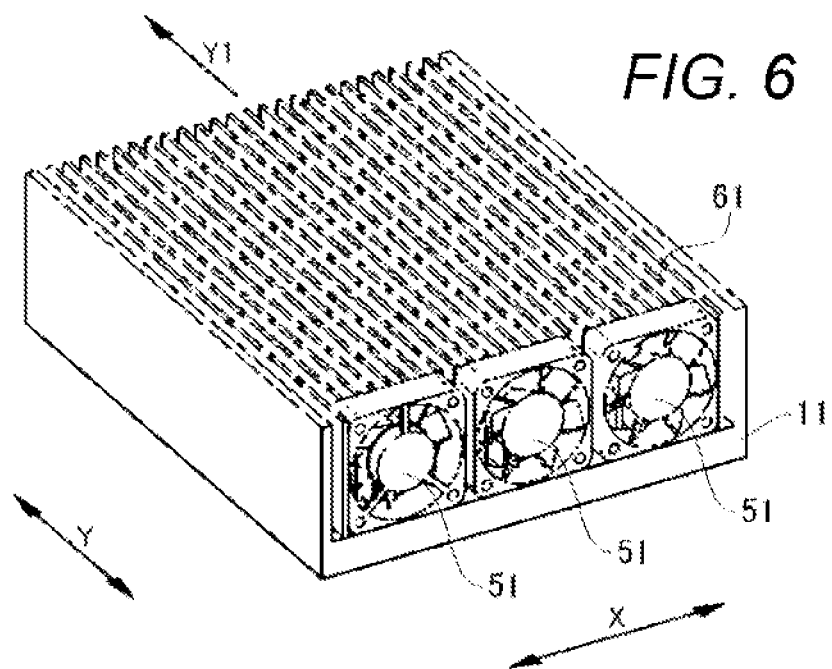
FIG. 6 is a perspective view illustrating a main part of an electronic control device according to a third embodiment.

FIG. 6 is a perspective view illustrating a main part of an electronic control device according to the third embodiment.

As illustrated in FIG. 6, each fan 51 is disposed at an end of the heat dissipation fins 61. Each fan 51 is disposed at an end of the housing 11 in the lateral direction Y. The lateral direction Y of the housing 11 is a direction parallel to the longitudinal direction of the heat dissipation fins 61. The end of the heat dissipation fins 61 in which the fans 51 are disposed is an upstream end in a direction in which cooling air flows when the heat dissipation fins 61 are air-cooled by air blowing from the fans 51. As described above, if the fans 51 are disposed at the end of the heat dissipation fins 61, the following advantageous effects can be obtained as compared with a case where the fans 51 are disposed at the center portion of the heat dissipation fins 61 as illustrated in FIG. 2.

First, when the fans 51 are disposed at the center portion of the heat dissipation fins 61, the heat dissipation fins 61 are disposed on one side and the other side centering on the fans 51. Therefore, the air sent out by the fans 51 flows separately into heat dissipation fins 61 on one side and heat dissipation fins 61 on the other side. Therefore, on the upper surface side of the first region 111 of the housing 11, the direction of air flowing through the heat dissipation fins 61 is two. In addition, the air flowing through the heat dissipation fins 61 becomes air containing heat released from the heat dissipation fins 61, that is, hot air, and the hot air is discharged from both sides in the lateral direction of the housing 11. The hot air discharged from the housing 11 may adversely affect other electronic control devices mounted on the vehicle. Therefore, when the fans 51 are disposed at the center portion of the heat dissipation fins 61, there is a restriction in layout that it is necessary to determine the mounting position of another electronic control device in consideration of the influence of hot air discharged from both sides in the lateral direction of the housing 11.

On the other hand, when the fans 51 are disposed at the end of the heat dissipation fins 61, the air flowing through the heat dissipation fins 61 by the fans 51 flows in one direction. Therefore, air (hot air) containing heat released from the heat dissipation fins 61 is discharged from only one side in the lateral direction of the housing 11. Therefore, when the fans 51 are disposed at the end of the heat dissipation fins 61, the mounting position of another electronic control device can be determined in consideration of only the influence of hot air discharged from one side in the lateral direction of the housing 11. Therefore, if a plurality of electronic control devices are mounted on a vehicle, it is possible to increase the degree of freedom of layout.

In addition to the electronic components 24, 25, and 26 described above, when there is an electronic component (not illustrated) that generates significant heat, in order to transfer heat, generated by the electronic component to the heat dissipation fins 61, a recess (not illustrated) may be formed in the region where the heat dissipation fins 61 are formed, and the electronic component may be disposed in the recess. As a result, heat generated by the electronic component can be efficiently transferred to the heat dissipation fins 61 and released to the outside. If the recess is formed in the region where the heat dissipation fins 61 are formed, the recess in which the electronic component can be disposed can be secured in the region where the heat dissipation fins 61 are formed by changing the shape and direction of the heat dissipation fins 61 according to the disposition of the electronic component.

Fourth Embodiment

Next, a fourth embodiment will be described.

Figure 7:
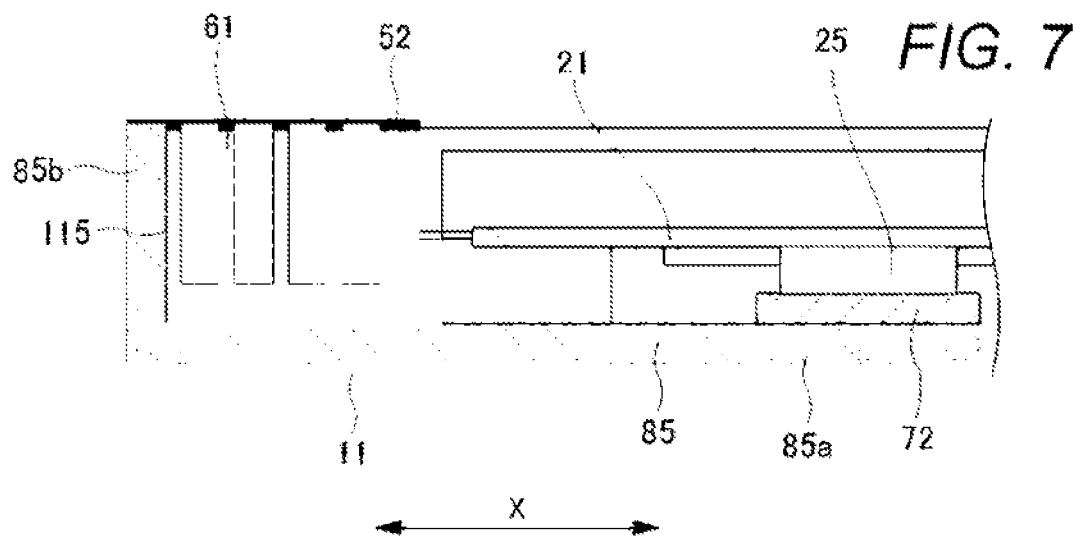
FIG. 7 is a cross-sectional view illustrating a main part of an electronic control device according to a fourth embodiment.

FIG. 7 is a cross-sectional view illustrating a main part of an electronic control device according to the fourth embodiment.

As illustrated in FIG. 7, the electronic control device according to the fourth embodiment includes heat pipes 85. The heat pipe 85 transfers heat generated by the electronic component 25 by the hydraulic liquid. The heat transfer speed of the heat pipe 85 is higher than the heat transfer speed of the metal material constituting the housing 11. One end 85a of the heat pipe 85 is in thermal contact, with the electronic component 25 via the heat dissipation material 72. The other end 85b of the heat pipe 85 is in thermal and physical contact with the heat dissipation fins 61. The other end 85*b* of the heat pipe 85 is inserted (fitted) into a through hole 115 provided in the housing 11 in a formation region of the heat dissipation fins 61.

In the fourth embodiment, since the heat pipe 85 that is in thermal contact with the electronic component 25 and the heat dissipation fins 61 is provided, heat generated by the electronic component 25 can be transferred to the heat dissipation fins 61 at a high transfer speed. The through hole 115 is provided in a formation region of the heat dissipation fins 61, and the heat pipe 85 is made to pass through the through hole 115, whereby the heat pipe 85 is brought into thermal contact with heat dissipation fins 61. Therefore, heat generated in the electronic component 25 can be efficiently released to the outside by directly air-cooling the heat dissipation fins 61 and the heat pipes 85 by the fans 51. Such an effect can also be obtained when heat pipes that are in thermal contact with the electronic component 24 and the heat dissipation fins 61 are provided, or when heat pipes that are in thermal contact with the electronic component 26 and the heat dissipation fins 61 are provided.

Fifth Embodiment

Next, a fifth embodiment will be described.

Figure 8:
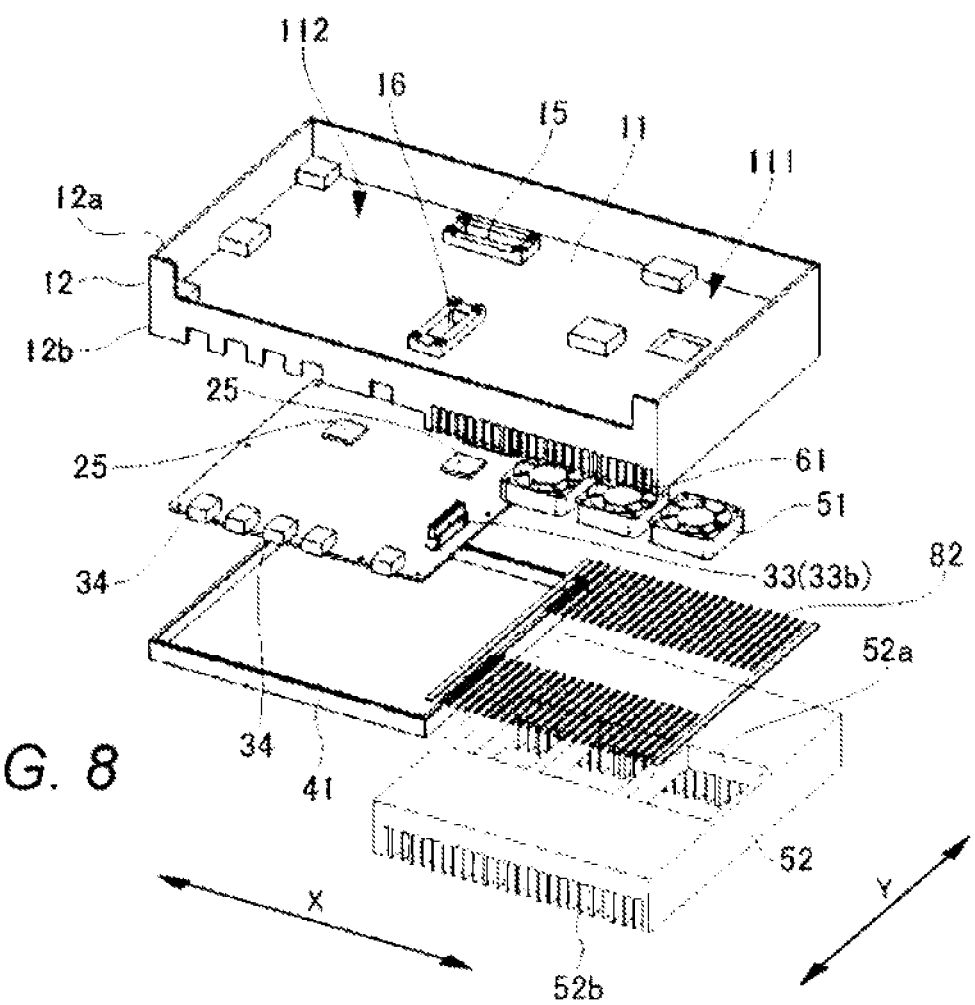
FIG. 8 is an exploded perspective view of an electronic control device according to a fifth embodiment as viewed from below.
Figure 9:
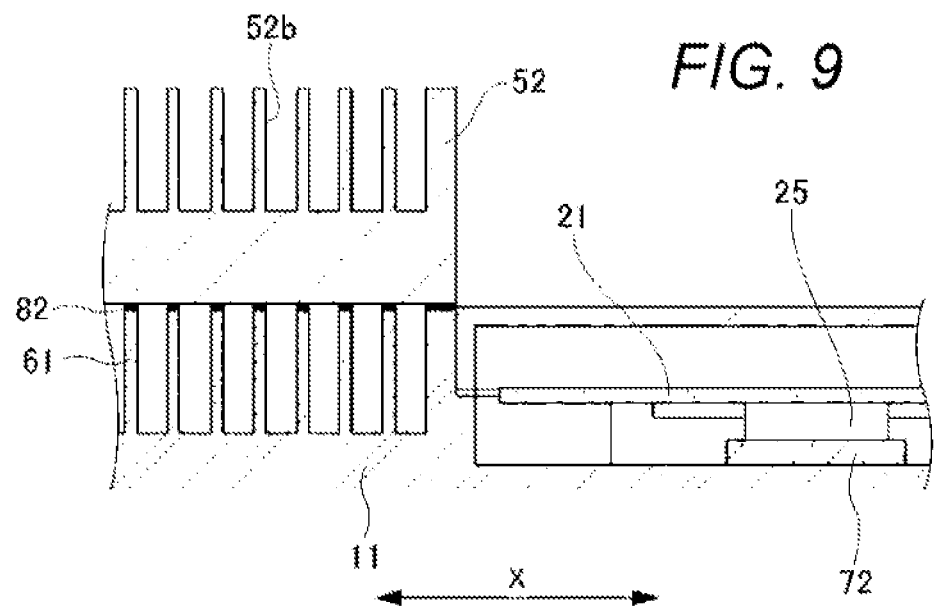
FIG. 9 is a cross-sectional view illustrating a main part of the electronic control device according to the fifth embodiment.

FIG. 8 is an exploded perspective view of an electronic control device according to the fifth embodiment as viewed from below, and FIG. 9 is a cross-sectional view illustrating a main part of the electronic control device according to the fifth embodiment. In FIG. 8, the second substrate 22, the third substrate 23, and the second cover 42 are not illustrated.

As illustrated in FIGS. 8 and 9, in the electronic control device according to the fifth embodiment, the fan cover 52 is made of a metal material having high thermal conductivity, and the fin 52*b* is integrally formed with the fan cover 52. The fin 52*b* is a plate-shaped fin formed on the upper surface side of the fan cover 52 and releases heat by natural convection. However, the fin 52*b* is not limited to a plate-shaped fin and may be a pin-shaped fin. The fan cover 52 is bonded to the heat dissipation fins 61 by a bonding material 82 such as a resin having thermal conductivity, or heat dissipation grease. The bonding material 82 is provided between the heat dissipation fins 61 and the fan cover 52 by being applied to at least one of the tip end surfaces of heat dissipation fins 61 and the lower surface of the fan cover 52. As a result, the formation region of the heat dissipation fins 61 in the housing 11 is in thermal contact with the fan cover 52 via the bonding material 82.

In the fifth embodiment, since the fin 52*b* is formed in the fan cover 52, the heat transferred from each of the electronic components 24, 25, and 26 to the heat dissipation fins 61 can be released not only from the heat dissipation fins 61 but also from the fin 52*b* of the fan cover 52. Therefore, the heat generated in each of the electronic components 24, 25, and 26 can be efficiently released to the outside.

Sixth Embodiment

Next, a sixth embodiment will be described.

Figure 10:
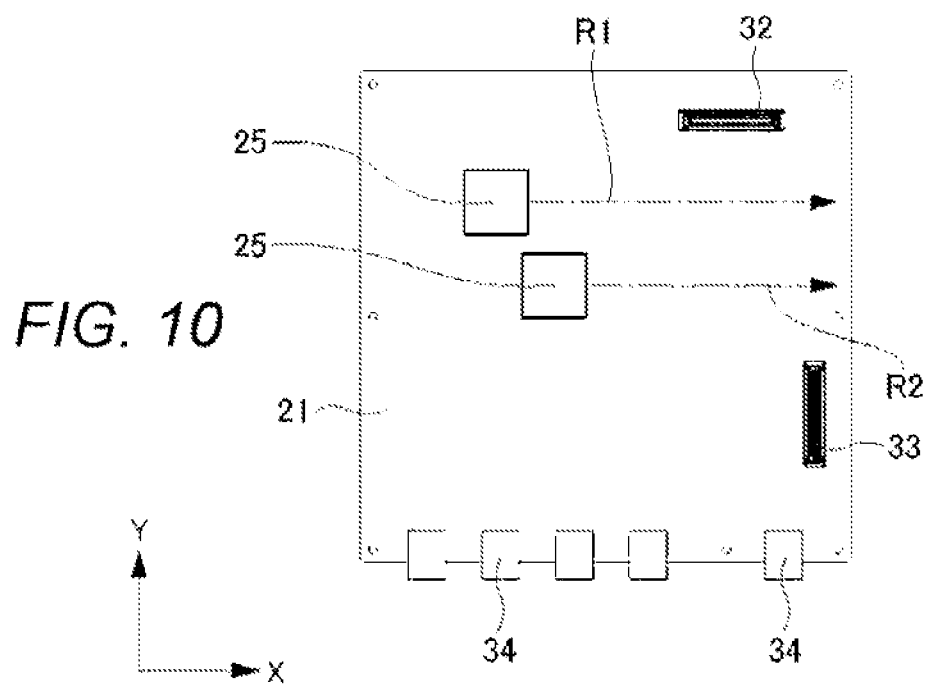
FIG. 10 is a bottom view illustrating a configuration of a first substrate included in an electronic control device according to a sixth embodiment.
Figure 11:
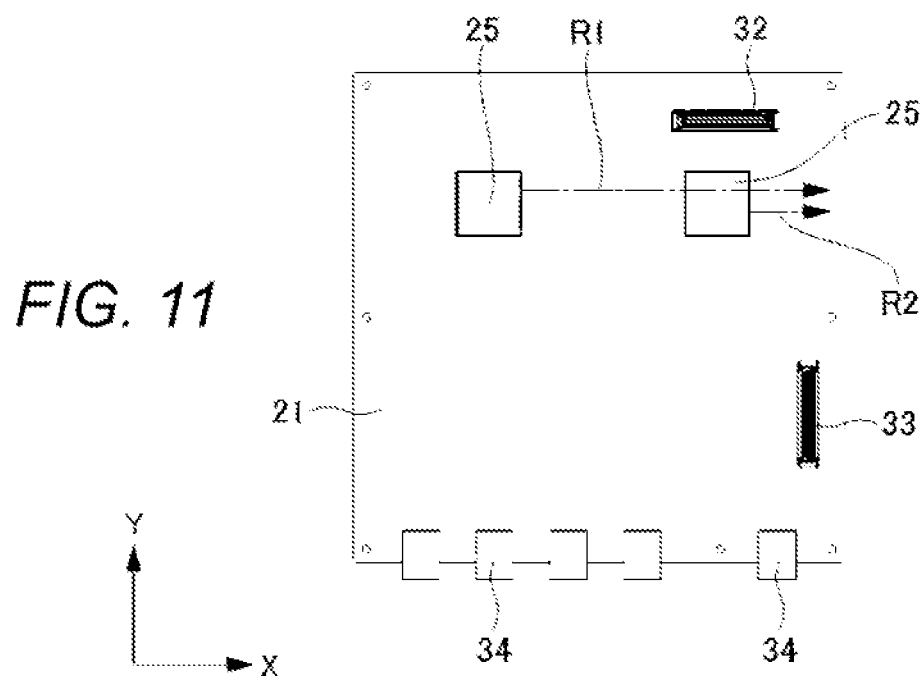
FIG. 11 is a bottom view illustrating a configuration of a first substrate to be compared with the sixth embodiment.

FIG. 10 is a bottom view illustrating a configuration of a first substrate included in an electronic control device according to the sixth embodiment, and FIG. 11 is a bottom view illustrating a configuration of a first substrate to be compared with the sixth embodiment.

In FIG. 10, the two electronic components 25 mounted on the lower surface of the first substrate 21 are arranged with their positions shifted in the Y direction so that their positions do not overlap each other in the Y direction. In other words, the two electronic components 25 are arranged in parallel in the X direction. On the other hand, in FIG. 11, the two electronic components 25 are disposed at the same position in the Y direction such that their positions overlap each other in the Y direction. In other words, the two electronic components 25 are arranged in series in the X direction.

Here, as described above, the X direction is the longitudinal direction of the housing 11, and is also the arrangement direction of the first region 111 and the second region 112. The heat dissipation fins 61 are formed on the upper surface side of the first region 111, and the electronic components 25 are in thermal contact with the upper surface side of the second region 112. Therefore, the heat transferred from each electronic component 25 to the housing 11 moves from the second region 112 toward the first region 111.

At this time, as illustrated in FIG. 11, when the positions of the two electronic components 25 overlap each other in the Y direction in the plane of the first substrate 21, a movement path R1 through which the heat transferred from one electronic component 25 to the housing 11 stoves from the second region 112 toward the first region 111, and a movement path R2 through which the heat transferred from the other electronic component 25 to the housing 11 moves from the second region 112 toward the first region 111 merge (interfere), and the heat transfer is not smoothly performed. On the other hand, in the sixth embodiment, as illustrated in FIG. 10, the electronic components 25 are arranged in parallel so that the positions of the two electronic components 25 do not overlap each other in the Y direction in the plane of the first substrate 21. Therefore, the movement path R1 through which the heat transferred from one electronic component 25 to the housing 11 moves from the second region 112 toward the first region 111, and the movement path R2 through which the heat transferred from the other electronic component 25 to the housing 11 moves from the second region 112 toward the first region 111 merge (interfere) in the middle in the X direction and the heat is transferred to the heat dissipation fins 61. Therefore, the heat generated in each electronic component 25 can be quickly transferred to the heat dissipation fins 61 through the movement paths R1 and R2.

In the sixth embodiment, the arrangement of the two electronic components 25 mounted on the first substrate 21 has been described, but the present invention is not limited thereto, and the two electronic components 25 mounted on the first substrate 21, the electronic component 24 mounted on the second substrate 22, and the electronic component 26 mounted on the third substrate 23 may also be arranged in parallel with their positions shifted in the Y direction as described above. The number of electronic components arranged in parallel is not limited to two, and may be three or more.

Modification

The present invention is not limited to the above-described embodiments, and includes various modifications. For example, in the above-described embodiments, the contents of the present invention are described in detail for easy understanding, but the present invention is not necessarily limited to one including all the configurations described in the above-described embodiments. Further, a part of one embodiment can be replaced with a configuration of another embodiment. Further, a part of one embodiment can be added to a configuration of another embodiment. In addition, a part of the configuration of each embodiment can be deleted, another configuration can be added, or another configuration can be substituted.

For example, in the above-described embodiment, the electronic control device used in an automobile (electronic control device for a vehicle) has been described as an example, but the electronic control device according to the present invention may be used for applications other than an automobile.

REFERENCE SIGNS LIST 11 housing
15, 16 hole
21 first substrate
22 second substrate
23 third substrate
24 electronic component (PCIeSW)
25 electronic component (image processing SoC)
26 electronic component (accelerator)
31 BtoB connector (second BtoB connector)
32, 33 BtoB connector (first BtoB connector)
41 first cover
42 second cover
51 fan
52 fan cover
52b fin
85 heat pipe
91 waterproof material
100 electronic control device
111 first region
112 second region

The invention claimed is:

1. An electronic control device comprising:
a housing including
a first region in which heat dissipation fins are formed on a first side and a first electronic component generating a largest amount of heat is in thermal contact with a second side, and
a second region in which a second electronic component is in thermal contact with the first side and the second side,
wherein the first region and the second region are divided in a longitudinal direction of the housing, and
wherein the first region and the second region are on a same plane.

2. The electronic control device according to claim 1, further comprising:
a first substrate on which the second electronic component, that is in thermal contact with an upper surface side of the second region, is mounted; and
a second substrate on which a third electronic component, that is in thermal contact with a lower surface side of the second region, is mounted,
wherein the first substrate is fixed to the first side of the housing, and the second substrate is fixed to the second side of the housing.

3. The electronic control device according to claim 2, further comprising:
a first BtoB connector that connects the first substrate and the second substrate, wherein
the housing is formed with a hole through which the first BtoB connector is inserted, and
a longitudinal direction of the hole is formed to be substantially parallel to an arrangement direction of the first region and the second region.

4. The electronic control device according to claim 3, further comprising:
a third substrate on which the first electronic component is mounted; and
a second BtoB connector that connects the second substrate and the third substrate,
wherein the second BtoB connector is provided on a surface of the third substrate on which the first electronic component is mounted and a surface of the second substrate on which the third electronic component is mounted.

5. The electronic control device according to claim 4, wherein
the first electronic component is an accelerator,
the second electronic component is an image processing SoC, and
the third electronic component is a PCIeSW.

6. The electronic control device according to claim 5, wherein
the accelerator and the second BtoB connector are mounted on a same surface of the third substrate by BGA,
the PCIeSW, the second BtoB connector, and the first BtoB connector are mounted on a same surface of the second substrate by BGA, and
the image processing SoC and the first BtoB connector are mounted on a same surface of the first substrate by BGA.

7. The electronic control device according to claim 6, further comprising:
an air cooling fan provided on the first side of the first region; and
a fan cover provided to cover the heat dissipation fins.

8. The electronic control device according to claim 7, wherein a first connector provided on the first substrate and a second connector provided on the second substrate are disposed on a same side of a side surface of the housing.

9. The electronic control device according to claim 8, further comprising:
a first cover provided to cover an opening on the first side of the housing; and
a second cover provided to cover an opening on the second side of the housing, wherein
the first substrate is disposed in a space formed by the housing and the first cover,
the second substrate and the third substrate are disposed in a space formed by the housing and the second cover, and
a waterproof material that fills gaps between the housing, the first cover, the second cover, the first connector, and the second connector is included.

10. The electronic control device according to claim 1, wherein
the housing includes a recess, and
the second electronic component is disposed in the recess.

11. The electronic control device according to claim 10, wherein a gap formed between the recess and the second electronic component is filled with a heat dissipation material.

12. The electronic control device according to claim 7, further comprising the fan at an end of the heat dissipation fins.

13. The electronic control device according to claim 1, further comprising a heat pipe that is in thermal contact with both the second electronic component and the heat dissipation fins.

14. The electronic control device according to claim 7, wherein a fin is formed in the fan cover.

15. The electronic control device according to claim 2, wherein
- at least two electronic components are mounted on the first substrate, and
- the at least two electronic components are arranged in parallel with respect to an arrangement direction of the first region and the second region.

16. An electronic control device comprising:
- a housing including
  - a first region in which heat dissipation fins are formed on a first side and a first electronic component generating a largest amount of heat is in thermal contact with a second side, and
  - a second region in which a second electronic component is in thermal contact with the first side and the second side,
  - wherein the first region and the second region are divided in a longitudinal direction of the housing;
- a first substrate on which the second electronic component, that is in thermal contact with an upper surface side of the second region, is mounted;
- a second substrate on which a third electronic component, that is in thermal contact with a lower surface side of the second region, is mounted;
- a third substrate on which the first electronic component is mounted,
  - wherein the first substrate is fixed to the first side of the housing, and the second substrate is fixed to the second side of the housing;
- a first BtoB connector that connects the first substrate and the second substrate; and
- a second BtoB connector that connects the second substrate and the third substrate,
- wherein the housing is formed with a hole through which the first BtoB connector is inserted,
- wherein a longitudinal direction of the hole is formed to be substantially parallel to an arrangement direction of the first region and the second region, and wherein the second BtoB connector is provided on a surface of the third substrate on which the first electronic component is mounted and a surface of the second substrate on which the third electronic component is mounted.

* * * * *